(12) United States Patent
Shin et al.

(10) Patent No.: US 12,378,120 B2
(45) Date of Patent: Aug. 5, 2025

(54) WIRING INCLUDING GRAPHENE LAYER AND METHOD OF MANUFACTURING THE SAME

(71) Applicants: Samsung Electronics Co., Ltd., Suwon-si (KR); SEOUL NATIONAL UNIVERSITY R&DB FOUNDATION, Seoul (KR)

(72) Inventors: Keunwook Shin, Yongin-si (KR); Kibum Kim, Seoul (KR); Kyung-Eun Byun, Seongnam-si (KR); Hyeonjin Shin, Suwon-si (KR); Minhyun Lee, Suwon-si (KR); Changseok Lee, Gwacheon-si (KR)

(73) Assignees: Samsung Electronics Co., Ltd., Gyeonggi-do (KR); Seoul National University R&DB Foundation, Seoul (KR)

(*) Notice: Subject to any disclaimer, the term of this patent is extended or adjusted under 35 U.S.C. 154(b) by 603 days.

(21) Appl. No.: 17/829,679

(22) Filed: Jun. 1, 2022

(65) Prior Publication Data

US 2023/0079680 A1    Mar. 16, 2023

(30) Foreign Application Priority Data

Sep. 15, 2021    (KR) .................. 10-2021-0123368

(51) Int. Cl.
| | | |
|---|---|---|
| C01B 32/186 | (2017.01) | |
| C01B 32/188 | (2017.01) | |
| H10D 64/01 | (2025.01) | |
| H10D 64/20 | (2025.01) | |

(52) U.S. Cl.
CPC .......... *C01B 32/186* (2017.08); *C01B 32/188* (2017.08); *H10D 64/01* (2025.01); *H10D 64/205* (2025.01); *C01B 2204/04* (2013.01); *C01B 2204/22* (2013.01); *C01B 2204/32* (2013.01)

(58) Field of Classification Search
CPC ...... C01B 32/186; C01B 32/188; H10D 64/01
USPC ......................................... 257/69
See application file for complete search history.

(56) References Cited

U.S. PATENT DOCUMENTS

| | | | |
|---|---|---|---|
| 8,476,765 | B2 | 7/2013 | Zhang et al. |
| 8,541,769 | B2 | 9/2013 | Chu et al. |
| 9,482,960 | B2 | 11/2016 | Yakunin et al. |
| 10,312,329 | B2 | 6/2019 | Zhou |
| 2012/0208022 | A1* | 8/2012 | Merino Sanchez ... C01B 32/186 216/96 |

(Continued)

FOREIGN PATENT DOCUMENTS

| | | |
|---|---|---|
| JP | 2016-174039 A | 9/2016 |
| JP | 6225596 B2 | 11/2017 |

(Continued)

*Primary Examiner* — Xia L Cross
(74) *Attorney, Agent, or Firm* — HARNESS, DICKEY & PIERCE, P.L.C.

(57) ABSTRACT

Provided are a wiring including a graphene layer and a method of manufacturing the wiring. The method may include growing a graphene layer on a substrate and doping the graphene layer with a metal. The graphene layer may be grown using a plasma of a hydrocarbon at a temperature of about 200° C. to about 600° C. by plasma enhanced chemical vapor deposition (PECVD).

20 Claims, 10 Drawing Sheets

(56) References Cited

U.S. PATENT DOCUMENTS

| | | | |
|---|---|---|---|
| 2015/0303487 A1* | 10/2015 | Kamai | C25B 11/043 |
| | | | 502/101 |
| 2016/0276219 A1* | 9/2016 | Wada | H01L 21/76832 |
| 2017/0179234 A1* | 6/2017 | Kim | H01L 21/02444 |
| 2019/0348466 A1 | 11/2019 | Pillarisetty et al. | |
| 2020/0235055 A1 | 7/2020 | Hegde et al. | |
| 2020/0350252 A1 | 11/2020 | Shin et al. | |
| 2021/0159183 A1 | 5/2021 | Byun et al. | |

FOREIGN PATENT DOCUMENTS

| | | |
|---|---|---|
| KR | 10-2020-0011197 A | 2/2020 |
| KR | 10-2020-0090088 A | 7/2020 |
| KR | 10-2020-0126925 A | 11/2020 |

\* cited by examiner

WIRING INCLUDING GRAPHENE LAYER AND METHOD OF MANUFACTURING THE SAME

CROSS-REFERENCE TO RELATED APPLICATION

This application is based on and claims priority under 35 U.S.C. § 119 to Korean Patent Application No. 10-2021-0123368, filed on Sep. 15, 2021, in the Korean Intellectual Property Office, the disclosure of which is incorporated by reference herein in its entirety.

BACKGROUND

1. Field

The present disclosure relates to wiring including a graphene layer and/or a method of manufacturing the wiring.

2. Description of the Related Art

As the size of devices gradually decreases, the size of a wiring arranged in the devices also decreases. In the related art, metals may be used as wiring in devices. However, the resistivity of metals exponentially increases as the size of the metals decreases. That is, metal wiring may not be suitable for small devices. Therefore, wiring including a new material instead of a metal may be needed for small devices.

SUMMARY

Provided are methods of manufacturing wiring by forming a graphene layer at a low temperature.

In the wiring manufacturing methods, the graphene layer may be doped with a metal in various manners to decrease the resistance of wiring.

Therefore, low-resistance wiring may be provided in small devices.

Additional aspects will be set forth in part in the description which follows and, in part, will be apparent from the description, or may be learned by practice of the presented embodiments of the disclosure.

According to an embodiment, a method of manufacturing a wiring may include growing a graphene layer on a substrate using a plasma of a hydrocarbon at a temperature of about 200° C. to about 600° C. by plasma enhanced chemical vapor deposition (PECVD); and doping the graphene layer with a metal.

In some embodiments, the PECVD may include at least one of inductively coupled plasma chemical vapor deposition (ICP-CVD), capacitively coupled plasma chemical vapor deposition (CCP-CVD), and microwave plasma chemical vapor deposition (MWP-CVD) In the PECVD, the plasma may be generated using at least one radio frequency (RF) plasma generator or at least one microwave (MW) plasma generator.

In some embodiments, the growing the graphene layer may include injecting the hydrocarbon and a precursor including the metal together into a chamber. The doping the graphene layer may be performed as in-situ doping by the PECVD in the growing of the graphene layer.

In some embodiments, the doping the graphene layer with the metal may include performing atomic layer deposition (ALD) at least once or chemical vapor deposition (CVD) at least once.

In some embodiments, the method may further include depositing a metal thin film on the substrate prior to the growing the graphene layer. The graphene layer may be doped with the metal as the metal thin film undergoes agglomeration during the growing the graphene layer.

In some embodiments, the substrate may have a trench structure including a body and a protrusion, and the graphene layer may be grown inside the trench structure. In the growing the graphene layer, the graphene may be grown spaced apart from the protrusion such that an air gap may be formed between a side of the graphene layer and the protrusion.

In some embodiments, the metal may include one of ruthenium (Ru), aluminum (Al), molybdenum (Mo), tungsten (W), titanium (Ti), platinum (Pt), tantalum (Ta), rhodium (Rh), iridium (Ir), cobalt (Co), nickel (Ni), chromium (Cr), hafnium (Hf), titanium nitride (TiN), or an alloy thereof.

In some embodiments, the graphene layer may include at least one layer and the at least one layer may be formed in a direction substantially parallel or substantially perpendicular to a surface direction of the substrate, or the at least one layer may be formed to may have a structure including a portion substantially perpendicular to the surface direction of the substrate and a portion substantially parallel to the surface direction of the substrate.

In some embodiments, the doping the graphene layer may include at least one of doping a surface of the graphene layer with the metal, doping an inside of the graphene layer with the metal, and doping a grain boundary of the graphene layer with the metal.

In some embodiments, the growing the graphene layer and the doping the graphene layer with the metal may be performed simultaneously.

In some embodiments, in the growing the graphene layer, the graphene layer may be grown directly on a surface of the substrate.

In some embodiments, the doping the graphene layer with the metal may include depositing particles of the metal on a surface of the graphene layer.

In some embodiments, the doping the graphene layer with the metal may include depositing particles of the metal inside the graphene layer.

In some embodiments, the method may further include forming a barrier on the substrate before the forming the graphene layer. The growing the graphene layer on the substrate may include growing the graphene layer on the barrier.

According to an embodiment, a wiring may include a substrate; and a graphene layer doped with a metal and on the substrate. A metal content of the graphene layer doped with the metal may be about 1 at % to about 50 at %, and a ratio of carbon having an $sp^2$ bond structure to total carbon in the graphene layer doped with the metal may be about 50% to about 99%.

In some embodiments, the substrate may have a trench structure. The substrate may include a dielectric material having a dielectric constant κ of about 3.6 or less. The graphene layer doped with the metal may be inside the trench structure.

In some embodiments, the graphene layer doped with the metal may have a hydrogen (H) content in a range of about 1 at % to about 20 at %.

In some embodiments, the metal may include one of ruthenium (Ru), aluminum (Al), molybdenum (Mo), tungsten (W), titanium (Ti), platinum (Pt), tantalum (Ta), rhodium (Rh), iridium (Ir), cobalt (Co), nickel (Ni), chromium (Cr), hafnium (Hf), titanium nitride (TiN), and an alloy thereof.

In some embodiments, the substrate may include a protrusion and the graphene layer may be spaced apart from the protrusion such that an air gap may be arranged on a side of the graphene layer doped with the metal.

In some embodiments, the graphene layer doped with the metal may have a width of about 1 nm to about 20 nm and a height of about 1 nm to about 20 nm, and the graphene layer doped with the metal may have a resistivity of about 800 µΩ·cm or less.

In some embodiments, at least one layer included in the graphene layer doped with the metal may be arranged in a direction substantially parallel to a surface direction of the substrate.

In some embodiments, at least one layer included in the graphene layer doped with the metal may be arranged in a direction substantially perpendicular to a surface direction of the substrate, or the least one layer included in the graphene layer doped with the metal may have a structure including a portion substantially perpendicular to the surface direction of the substrate and a portion substantially parallel to the surface direction of the substrate.

In some embodiments, at least one of a surface of the graphene layer, an inside of the graphene layer, and a grain boundary of the graphene layer may be doped with the metal.

According to an embodiment, an electronic device may include the wiring and a transistor. The transistor may include a source electrode, a drain electrode, and a gate electrode. The wiring may electrically connected to at least one of the source electrode, the drain electrode, and the gate electrode.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
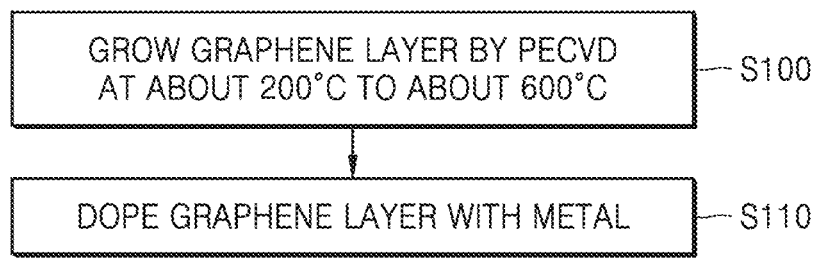
FIG. 1 is a flowchart illustrating a wiring manufacturing method according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, embodiments will be described with reference to the accompanying drawings. The embodiments described herein are for illustrative purposes only, and various modifications may be made therein. In the drawings, like reference numerals refer to like elements, and the sizes of elements may be exaggerated for clarity of illustration.

In the following description, when an element is referred to as being "above" or "on" another element, it may be directly on the other element while making contact with the other element or may be above the other element without making contact with the other element. Similarly, when an element is referred to as being "below" or "on" another element, it may be directly on the other element while making contact with the other element or may be below the other element without making contact with the other element.

The terms of a singular form may include plural forms unless otherwise mentioned. It will be further understood that the terms "comprises" and/or "comprising" used herein specify the presence of stated features or elements, but do not preclude the presence or addition of one or more other features or elements.

An element referred to with the definite article or a demonstrative pronoun may be construed as the element or the elements even though it has a singular form.

The meaning of "connection" may include not only physical connection, but also optical connection, electrical connection, and the like.

In addition, examples or exemplary terms (for example, "such as" and "etc.") are used for the purpose of description and are not intended to limit the scope of the present disclosure unless defined by the claims.

It will be understood that although terms such as "first" and "second" are used herein to describe various elements, these elements should not be limited by these terms. These terms are only used to distinguish one element from other elements.

When one length such as a height, a depth, or a thickness is referred to being the same as another length, there may be a difference between the lengths within an error range acceptable by those of ordinary skill in the art.

A description of a wiring manufacturing method according to an embodiment may correspond to a description of a wiring according to another embodiment.

Figure 2A:
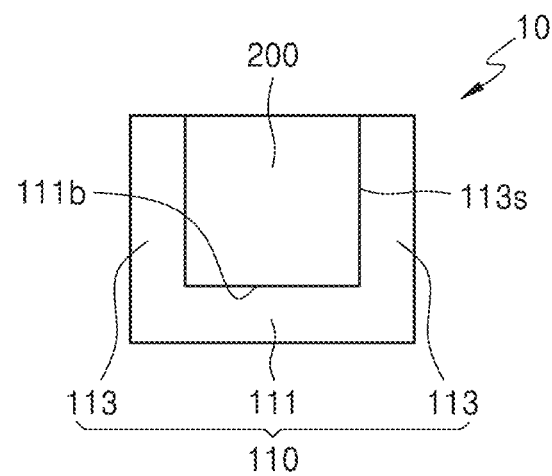
FIGS. 2A and 2B are cross-sectional views illustrating a wiring, which includes a substrate having a trench structure according to an example embodiment.
Figure 2B:
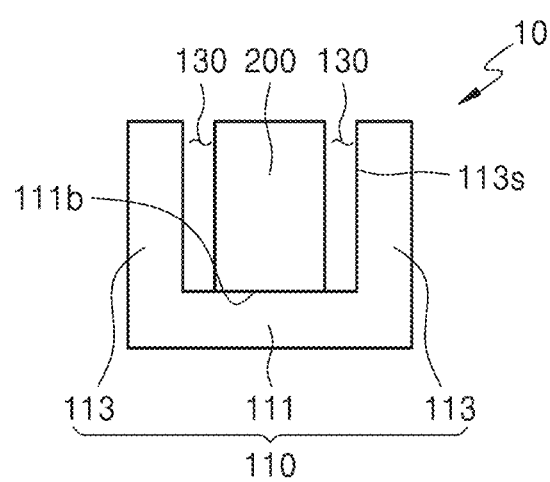
Figure 3:
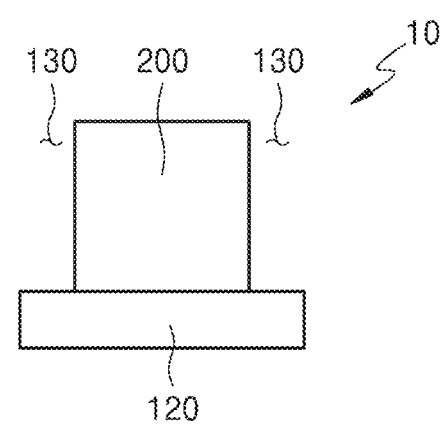
FIG. 3 is a cross-sectional view illustrating a wiring, which is arranged on a substrate having a flat upper surface according to an example embodiment.

FIG. 1 is a flowchart illustrating a wiring manufacturing method according to an example embodiment. FIGS. 2A and 2B are cross-sectional views illustrating a wiring which includes a substrate having a trench structure according to an example embodiment. FIG. 3 is a cross-sectional view illustrating wiring arranged on a substrate having a flat upper surface according to an example embodiment.

Referring to FIGS. 1 to 3, a method of manufacturing a wiring 10 according to an example embodiment may include: growing a graphene layer 200 including at least one layer on a substrate 110 or 120 by plasma enhanced chemical vapor deposition (PECVD); and doping the graphene layer 200 with a metal M (see FIGS. 4A to 4C), wherein the growing of the graphene layer 200 may be performed by growing the graphene layer 200 directly on the substrate 110 or 120 at a temperature of about 200° C. to about 600° C. When the graphene layer 200 is grown, hydrocarbon plasma may be used. The wiring 10 manufactured by the wiring manufacturing method according to the example embodiment may be used in a small device as low-resistance wiring, and because the graphene layer 200 is directly grown on the substrate 110 or 120 at a low temperature equal to or less than 600° C. without requiring a high-temperature growth process of which the process temperature is higher than 600° C., front-end-of-line (FEOL) elements or structures arranged below the graphene layer 200 may be less damaged or may not be damaged. In addition, according to an example embodiment, the wiring 10 may be doped with the metal M, and thus, even when the wiring 10 is used in a small device, the wiring 10 may have low resistance.

In the wiring manufacturing method of example embodiments, the graphene layer 200 including at least one layer may be grown on the substrate 110 or 120 by PECVD (operation S100). When the graphene layer 200 is grown, hydrocarbon plasma may be used. For example, the substrate 110 may have a trench structure, and the substrate 120 may have a flat upper surface. The substrate 110 having a trench structure may have a non-planar upper surface having a height difference.

Referring to FIGS. 2A and 2B, the substrate 110 having a trench structure may be used. The substrate 110 may include: a body 111 including a trench bottom surface 111b of the trench structure; and protrusions 113 surrounding trench sidewalls 113s of the trench structure. The body 111 and the protrusions 113 of the substrate 110 may include a dielectric material or a semiconductor material, and the protrusions 113 may extend from the body 111. The graphene layer 200 may be grown to fill the trench structure. For example, the graphene layer 200 may be grown to entirely or partially fill the trench structure. When the graphene layer 200 is grown to entirely fill the trench structure, both sides of the graphene layer 200 may be in contact with the protrusions 113 of the substrate 110. When the graphene layer 200 is grown to partially fill the trench structure, both sides of the graphene layer 200 may be apart from the protrusions 113 of the substrate 110. That is, the graphene layer 200 may not be in contact with the trench sidewalls 113s. When both sides of the graphene layer 200 are arranged apart from the protrusions 113 of the substrate 110, voids 130 (described later) may be formed, and when the voids 130 are air gaps filled with air, the air gaps may function as a dielectric material. However, this is an example, and even when the graphene layer 200 is grown to partially fill the trench structure, at least one side of the graphene layer 200 may be in contact with one of the protrusions 113 of the substrate 110.

Referring to FIG. 3, when the substrate 120 having a flat upper surface is used, the graphene layer 200 may be grown on the flat upper surface of the substrate 120. In this case, both sides of the graphene layer 200 may be respectively in contact with voids 130. The voids 130 may be empty spaces rather than additional material layers, and for example, when the voids 130 are filled with air, the voids 130 may form air gaps. When the graphene layer 200 is formed between the voids 130 instead of sides of the graphene layer 200 being in contact with additional material layers, the voids 130 forming air gaps may function as a dielectric material. At 25° C., the dielectric constant of air is 1.00059, that is, close to about 1. The graphene layer 200 may be grown between the voids 130 filled with air, but embodiments are not limited thereto. In another example, the graphene layer 200 may be grown between the voids 130 filled with a gas other than air.

In the wiring manufacturing method according to example embodiments, the substrates 110 and 120 may include a semiconductor material or a dielectric material, or both a semiconductor material and a dielectric material such as a semiconductor on insulator substrate. When the substrates 110 and 120 include a semiconductor material, the substrates 110 and 120 may include at least one selected from the group consisting of silicon (Si), germanium (Ge), carbon (C), silicon carbide (SiC), silicon germanium (SiGe), a germanium (Ge) alloy, gallium arsenide (GaAs), indium arsenide (InAs), indium phosphide (InP), a Group IV semiconductor material, and a Group III-V compound semiconductor material. The substrates 110 and 120 may include a dielectric material (low-κ material) having a low dielectric constant κ among various dielectric materials. Here, the low-κ (low-resistivity) material may refer to a material having a dielectric constant κ lower than that of silicon dioxide ($SiO_2$). In a small device, the interval between transistors T or the interval between wires of the wiring 10 may be small. Therefore, the size of an insulating layer, which is arranged on the substrate 110 or 120 including a dielectric material or between wires of the wiring 10, may also be small, and thus, crosstalk having a negative effect on the performance of devices may occur. The use of a low-κ material may reduce parasitic capacitance having a negative effect on the performance of devices, and may also enable fast switching and low heat dissipation. For example, the dielectric material included in the substrates 110 and 120 may have a dielectric constant κ of less than about 3.6. For example, the dielectric material may include SiOCH or the like.

In the wiring manufacturing method of example embodiments, the graphene layer 200 may be grown by PECVD. In the PECVD, a gaseous compound (precursor) may be allowed to react with a surface of the substrate 110 or 120 to form a thin film of an intended material or grow an intended material through the decomposition of the gaseous compound. The graphene layer 200 may include at least one layer. For example, the graphene layer 200 may have a single-layer structure or a multi-layer structure. The graphene layer 200 may include intrinsic graphene or nanocrystalline graphene.

The intrinsic graphene may be crystalline graphene having crystals greater than about 100 nm. In addition, the nanocrystalline graphene may have crystals smaller than the crystals of the intrinsic graphene. For example, the nanocrystalline graphene may have crystals having a size of about 0.5 nm to about 1 μm.

The characteristics of carbon or the like which forms the graphene layer 200 may be measured by X-ray photoelectron spectroscopy (XPS) analysis, and the ratio of carbon having an $sp^2$ bond structure to total carbon in the intrinsic graphene may be about 100%. The intrinsic graphene may contain little or no hydrogen.

The ratio of carbon having an $sp^2$ bond structure to total carbon in the nanocrystalline graphene may be about 50% to about 99%. In addition, the nanocrystalline graphene may include, for example, hydrogen in an amount of about 1 at % to about 20 at %.

When the graphene layer 200 is grown, a hydrocarbon may be used as a precursor. For example, a reaction gas such as acetylene ($C_2H_2$) or methane ($CH_4$) may be used to grow the graphene layer 200. For the growth of the graphene layer 200, hydrogen ($H_2$) and/or argon (Ar) gas may be injected into a reaction chamber. However, the hydrocarbon is not limited to acetylene ($C_2H_2$) or methane ($CH_4$), and various other hydrocarbons may be used as precursors to grow the graphene layer 200.

PECVD may include at least one selected from the group consisting of inductively coupled plasma chemical vapor deposition (ICP-CVD), capacitively coupled plasma chemical vapor deposition (CCP-CVD), and microwave plasma chemical vapor deposition (MWP-CVD).

In PECVD, plasma may be generated by at least one radio frequency (RF) plasma generator or at least one microwave (MW) plasma generator.

The plasma may include RF plasma having a frequency range of about 3 MHz to about 100 MHz or MW plasma having a frequency range of about 0.7 GHz to about 2.5 GHz.

Power for generating plasma of the reaction gas may be about 10 W to about 4000 W.

Operation S100 of growing the graphene layer 200 using PECVD may be performed at a temperature of about 200° C. to about 600° C. For example, the growth operation S100 may be performed at a temperature of about 400° C. to about 600° C. When the graphene layer 200 is directly grown on the substrate 110 or 120 or a device at a temperature higher than 600° C., the substrate 110 or 120 or the device may be damaged during the growth operation S100. In the wiring manufacturing method of example embodiments, the graphene layer 200 may be grown at a low temperature equal to or less than about 600° C. or less, and thus the substrate 110 or 120 or the device may not be damaged or may be less damaged. In addition, because the graphene layer 200 is directly grown on the substrate 110 or 120 or the device at a low temperature, an operation of transferring a grown graphene layer to the substrate 110 or 120 or the device may not be required, and errors caused by such a transfer operation may be limited and/or prevented. In addition, a bonding layer may not be arranged between the graphene layer 200 and the substrate 110 or 120 or the device.

In the wiring manufacturing method of example embodiments, a barrier 400 (refer to FIG. 9B) additionally may be formed between the substrate 110 or 120 and the graphene layer 200, and thus the metal M doped in the graphene layer 200 also may further limit or reduce diffusion of metal into the substrate 110 or 120 owing to the barrier 400. For example, the thickness of the barrier 400 may be several hundred picometers to several tens of nanometers (e.g., 20 nm to 100 nm).

In the wiring manufacturing method of example embodiments, a liner 500 (refer to FIG. 9B) additionally may be formed between the substrate 110 or 120 and the graphene layer 200 to improve adhesion between the substrate 110 or 120 and the graphene layer 200. For example, the thickness of the liner 500 may be several hundred picometers to several tens of nanometers (e.g., 20 nm to 100 nm).

When the wiring 10 manufactured by the wiring manufacturing method of example embodiments further includes the barrier 400 and the liner 500, the substrate 110 or 120, the barrier 400, the liner 500, and the graphene layer 200 may be formed and arranged in this stated order.

In the method of manufacturing the wiring 10 according to example embodiments, the graphene layer 200 may be doped with the metal M (doping operation S110). In example embodiments, the graphene layer 200 may be doped with the metal M, and thus, the resistivity of the wiring 10 may be reduced. For example, after the doping operation S110, the content of the metal M in the graphene layer 200 may be about 1 at % to about 50 at %. Doping with the metal M may be performed a plurality of times to form the wiring 10 as low-resistance wiring, and the content of the metal M in the graphene layer 200 may be appropriately selected by considering an intended low level of resistance of the wiring 10 and the number of times of doping. The operation S110 of doping the graphene layer 200 with the metal M may be performed together with or after the operation S100 of growing the graphene layer 200.

After the doping operation S110, the graphene layer 200 may have a large amount of carbon having an $sp^2$ bond structure. For example, after the doping operation S110, the ratio of carbon having an $sp^2$ bond structure to total carbon in the graphene layer 200 may be about 50% to about 99%. In addition, after the doping operation S110, the content of carbon having an $sp^2$ bond structure may be greater than the content of carbon having an spa bond structure in the graphene layer 200.

After the doping operation S110, the graphene layer 200 may include hydrogen (H), and the content of hydrogen (H) may be about 1 at % to about 20 at %. However, the content of hydrogen (H) is not limited thereto, and the content of hydrogen (H) may be greater or less than the range stated above.

Figure 4A:
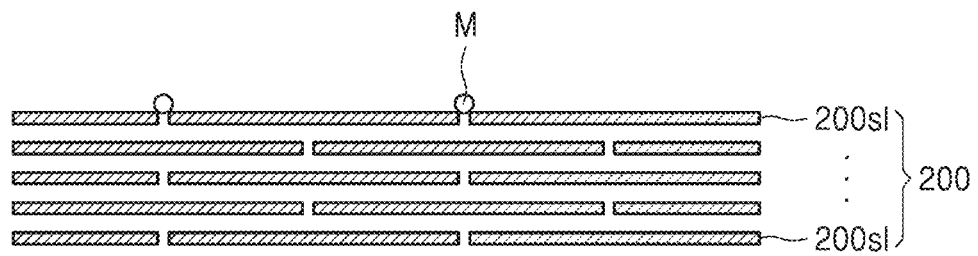
FIGS. 4A to 4C are cross-sectional views illustrating a graphene layer of wiring and metals with which the graphene layer is doped, according to example embodiments.
Figure 4B:
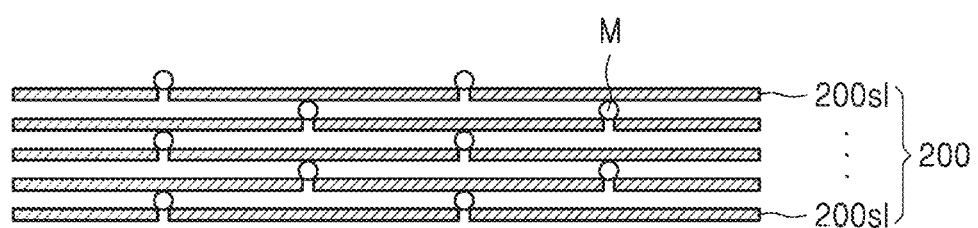
Figure 4C:
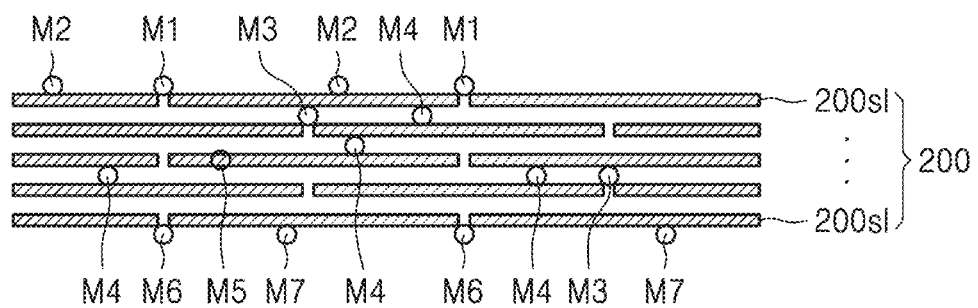

FIGS. 4A to 4C are cross-sectional views illustrating a graphene layer 200 of a wiring 10 and metals doped into the graphene layer 200 according to example embodiments.

The graphene layer 200 may include at least one layer. For example, the graphene layer 200 may include a unit graphene layer 200sl, or a plurality of unit graphene layers 200sl. A metal M may be doped to at least one position selected from the group consisting of a surface of the graphene layer 200, the inside of the graphene layer 200, and grain boundaries of the graphene layer 200. The inside of the graphene layer 200 may refer to surfaces of the plurality of unit graphene layers 200sl located inside the graphene layer 200, regions between the plurality of unit graphene layers 200sl located inside the graphene layer 200, or a domain included in one of the plurality of unit graphene layers 200sl of the graphene layer 200. The grain boundaries may be formed on a surface of the graphene layer 200, or on each of the plurality of unit graphene layers 200sl which are located inside the graphene layer 200.

Referring to FIG. 4A, the metal M may be on grain boundaries formed on the surface of the graphene layer 200. When the metal M is located on the surface of the graphene layer 200, the metal M may be on grain boundaries. However, this is a non-limiting example, and the metal M may be on portions other than grain boundaries. Referring to FIG. 4B, the metal M may be on grain boundaries formed in each of the plurality of unit graphene layers 200sl which are positioned inside the graphene layer 200. When the metal M is positioned inside the graphene layer 200, the metal M may be positioned on grain boundaries. However, this is a non-limiting example, and the metal M may be on portions other than grain boundaries.

Referring to FIG. 4C, the metal M may be positioned on the surfaces, inside, and grain boundaries of the graphene layer 200, and a basal plane of the graphene layer 200, which is not a grain boundary, may be doped with the metal M. For example, a first metal M1 and a sixth metal M6 may be respectively doped to and positioned on grain boundaries of different surfaces (upper and lower surfaces) of the graphene layer 200. A second metal M2 and a seventh metal M7 may be respectively doped to and positioned on basal planes of different surfaces (upper and lower surfaces) of the graphene layer 200. A third metal M3 may be doped to and positioned on grain boundaries formed in each of the plurality of unit graphene layers 200sl located inside the graphene layer 200. A fourth metal M4 may be doped to and positioned on basal planes of the plurality of unit graphene layers 200sl or regions between the plurality of unit graphene layers 200sl. A fifth metal M5 may be doped to and positioned in a domain included in one of the plurality of unit graphene layers 200sl of the graphene layer 200. The fifth metal M5 may be positioned inside the domain of the unit graphene layer 200sl by substituting carbon, or may be interstitially positioned inside the domain of the unit graphene layer 200sl. In the latter case, the fifth metal M5 may be located, for example, at a hollow site (H-site), a top site (T-site), or a bridge site (B-site) of the domain. The resistivity of the graphene layer 200 may be reduced owing to the metal M with which the graphene layer 200 is doped. According to the content of the metal M in the graphene layer 200, the resistivity of the graphene layer 200 may be reduced, and thus, the resistivity of the wiring 10 may also be reduced. The content of the metal M in the graphene layer 200 may be increased by performing the doping operation S110 a plurality of times. The content of the metal M in the graphene layer 200 may be determined by considering the number of times the doping operation S110 is performed and the resistivity of the graphene layer 200.

In addition, the metal M formed on a surface of the graphene layer 200 may improve adhesion between the graphene layer 200 and a layer making contact with the graphene layer 200. For example, the first metal M1 and the second metal M2 shown in FIG. 4C may enhance adhesion between the graphene layer 200 and an upper layer making contact with the graphene layer 200. In addition, the sixth metal M6 and the seventh metal M7 may enhance adhesion between the graphene layer 200 and a lower layer making contact with the graphene layer 200. For example, the lower layer may be the substrate 110 or 120.

In the wiring manufacturing method of example embodiments, the metal M with which the graphene layer 200 is doped may include, for example, one selected from the group consisting of ruthenium (Ru), aluminum (Al), molybdenum (Mo), tungsten (W), titanium (Ti), platinum (Pt), tantalum (Ta), rhodium (Rh), iridium (Ir), cobalt (Co), nickel (Ni), chromium (Cr), hafnium (Hf), titanium nitride (TiN), and an alloy thereof.

Next, examples of the growth operation S100 and the doping operation S110 will be described.

Figure 5:
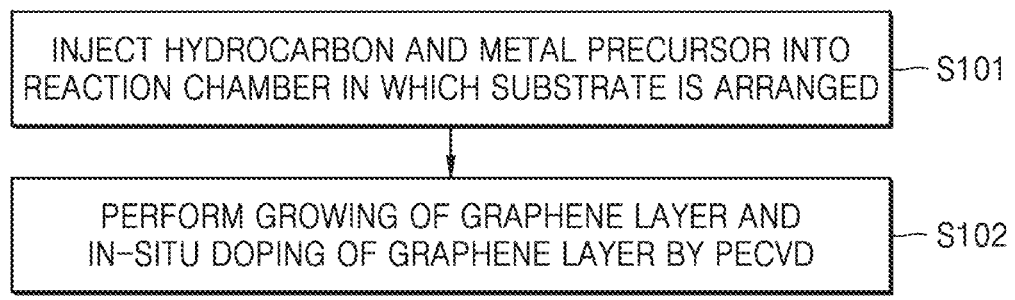
FIG. 5 is a flowchart illustrating a wiring manufacturing method according to an example embodiment.

FIG. 5 is a flowchart illustrating a wiring manufacturing method according to an example embodiment.

Referring to FIG. 5, the growth operation S100 and the doping operation S110 of the wiring manufacturing method may be simultaneously performed according to an example embodiment. A hydrocarbon (a precursor of a graphene layer 200), hydrogen ($H_2$), and argon (Ar) may be injected into a reaction chamber together with a metal precursor including a metal M to grow a graphene layer 200 (operation S101). Plasma is formed by PECVD, and because the metal precursor is injected together with the hydrocarbon when the graphene layer 200 is grown by PECVD (operation S100), plasma of the hydrocarbon and the metal precursor is formed by PECVD, such that the growth of the graphene layer 200 (operation S100) and doping with the metal M (operation S102) may be performed together (operation S102). In other words, the hydrocarbon and the metal precursor are injected together into the reaction chamber (operation S101), and growth of the graphene layer 200 by PECVD may be performed in situ with doping with the metal M such that the growth operation S100 and the doping operation S110 of the wiring manufacturing method may be simultaneously performed.

Figure 6A:
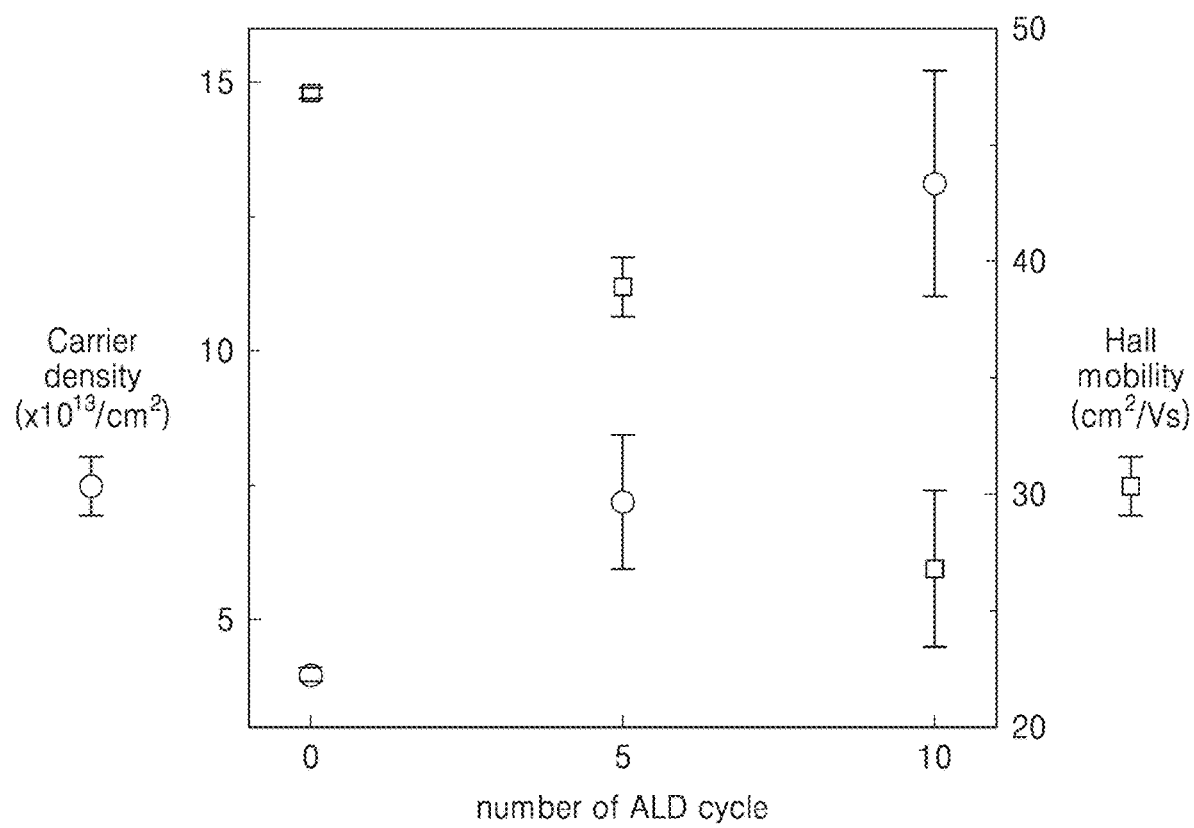
FIG. 6A is a graph illustrating the carrier density and Hall mobility of wiring with respect to the number of times a graphene layer is doped with ruthenium (Ru) by atomic layer deposition (ALD)
Figure 6B:
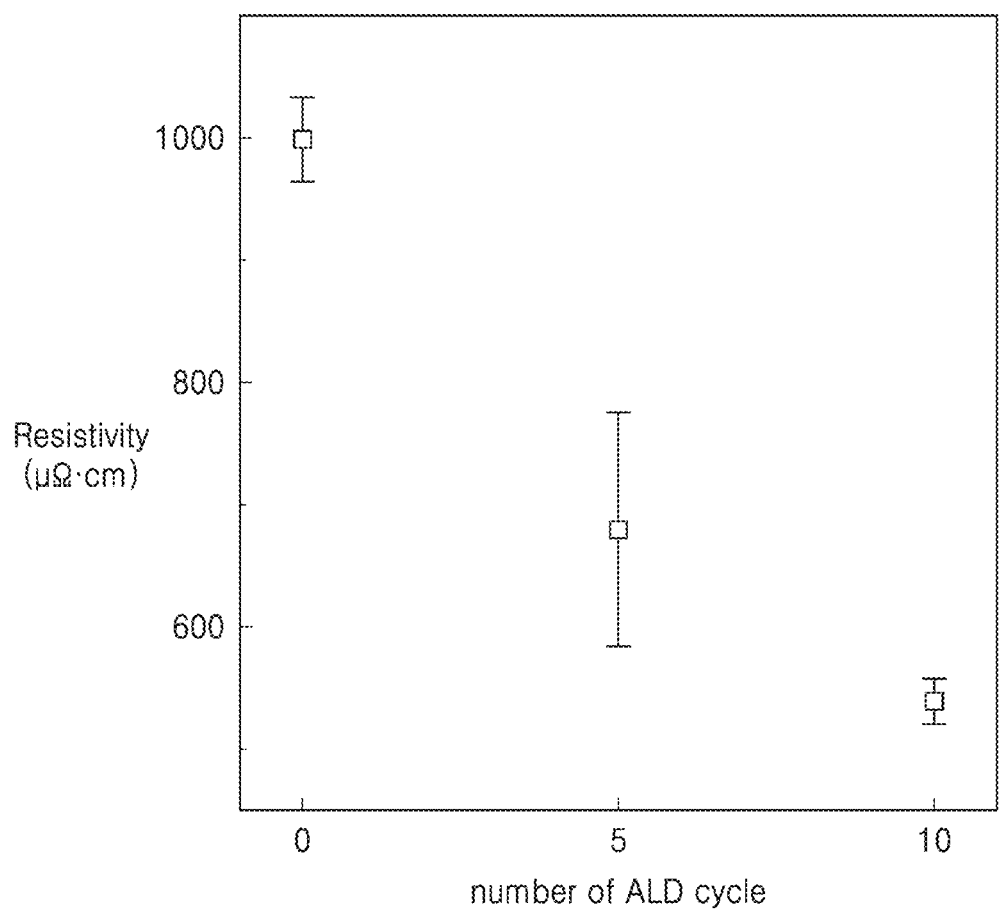
FIG. 6B is a graph illustrating the resistivity of a wiring with respect to the number of times a graphene layer is doped with ruthenium (Ru) by ALD.

FIG. 6A is a graph illustrating the carrier density and Hall mobility of a wiring 10 with respect to the number of times the graphene layer 200 is doped with ruthenium (Ru) by atomic layer deposition (ALD). FIG. 6B is a graph illustrating the resistivity of the wiring 10 with respect to the number of times the graphene layer 200 is doped with ruthenium (Ru) by ALD.

According to an example embodiment, the doping operation S110 of the wiring manufacturing method may include an operation of doping with the metal M by ALD and/or chemical vapor deposition (CVD). For example, when depositing the metal M on the graphene layer 200 by ALD, particles of the metal M may be deposited on a surface or the inside of the graphene layer 200, and thus, the resistivity of the wiring 10 may decrease because the particles of the metal M fill grain boundaries or transfer electrons by charge transfer.

Referring to FIGS. 6A and 6B, in the doping operation S110, a plurality of ALD cycles may be performed. Because of the plurality of ALD cycles, the content (concentration) of the metal M doped into the graphene layer 200 may gradually increase. As the plurality of cycles proceed, the density of carriers may increase.

Referring to FIG. 6A, the wiring 10 may have a carrier density of about $5\times10^{13}/cm^2$ before being doped, and a carrier density of about $6\times10^{13}/cm^2$ to about $8\times10^{13}/cm^2$ after being doped through five ALD cycles. In addition, the wiring 10 may have a carrier density of about $1\times10^{14}/cm^2$ to about $1.5\times10^{14}/cm^2$ after being doped through ten ALD cycles. The above-mentioned ranges may vary depending on the type of the metal M and operation conditions, and the range to which the carrier density of the wiring 10 may increase is not limited to the above-mentioned ranges.

In addition, referring to FIG. 6A, the wiring 10 may have a Hall mobility within a range of about 50 cm$^2$/Vs before being doped and within a range of about 38 cm$^2$/Vs to about 42 cm$^2$/Vs after being doped through five ALD cycles. In addition, the wiring 10 may have a Hall mobility of about 20 cm$^2$/Vs to about 30 cm$^2$/Vs after being doped through ten ALD cycles. The above-mentioned ranges may vary depending on the type of the metal M and operation conditions, and the range to which the Hall mobility may decrease is not limited to the ranges stated above.

When the resistivity of the wiring 10 is calculated using the carrier density and the Hall mobility shown in FIG. 6A, the wiring 10 may have a resistivity of about 1 mΩ·cm before being doped, and a resistivity of about 600 μΩ·cm to about 800 μΩ·cm after being doped through five ALD cycles, as shown in FIG. 6B. In addition, the wiring 10 may have a resistivity of about 600 μΩ·cm or less after being doped through ten ALD cycles. It could be understood that as the number of times of doping with the metal M by ALD increases, the content of the metal M in the graphene layer 200 increases, and the resistivity of the graphene layer 200 doped with the metal M decreases. Through this, a method of manufacturing a wiring 10 having low resistivity and a wiring 10 having low resistivity may be provided. The ranges stated above may vary depending on the type of the metal M and operation conditions, and the range to which the resistivity of the wiring 10 may decrease is not limited to the ranges stated above.

In the previous example, the graphene layer 200 is doped with ruthenium (Ru). However, embodiments are not limited thereto, and the graphene layer 200 may be doped with various metals.

Figure 7A:
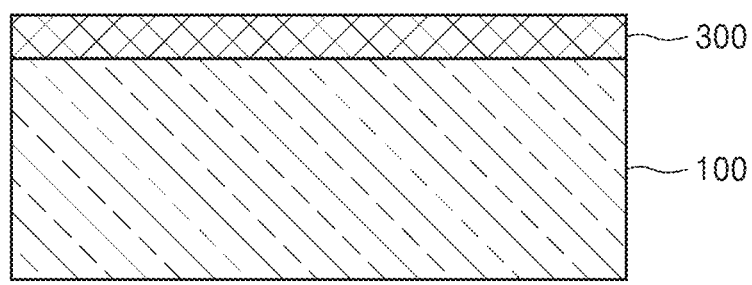
FIG. 7A is a cross-sectional view illustrating a substrate on which a metal thin film is deposited before a graphene layer is grown by a wiring manufacturing method according to an example embodiment.
Figure 7B:
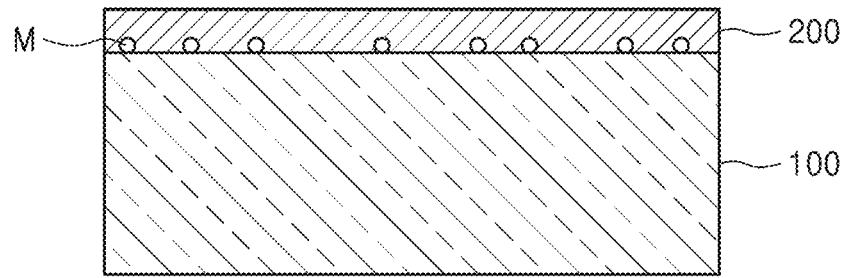
FIG. 7B is a cross-sectional view illustrating that when a graphene layer is grown, the graphene layer is doped through agglomeration of a metal of the metal thin film in the wiring manufacturing method of example embodiments.

FIG. 7A is a cross-sectional view illustrating a substrate 100 on which a metal thin film 300 is deposited before a graphene layer is grown by a wiring manufacturing method according to an example embodiment. FIG. 7B is a cross-sectional view illustrating how the graphene layer 200 is doped through agglomeration of the metal thin film 300 when the graphene layer 200 is grow by the wiring manufacturing method of example embodiments.

According to an example embodiment, the wiring manufacturing method may include an operation of depositing the metal thin film 300 on the substrate 100 before the growth operation S100. The metal thin film 300 may be deposited by ALD or CVD and may include, for example, one or more metals selected from the group consisting of ruthenium (Ru), aluminum (Al), molybdenum (Mo), tungsten (W), titanium (Ti), platinum (Pt), tantalum (Ta), rhodium (Rh), iridium (Ir), cobalt (Co), nickel (Ni), chromium (Cr), hafnium (Hf), titanium nitride (TiN), and an alloy thereof. The metal thin film 300 may undergo agglomeration by PECVD in the growth operation S100, and owing to the agglomeration, the graphene layer 200 may be doped with a metal M (operation S110). That is, in this case, the growth operation S100 and the doping operation S110 may be simultaneously performed. Atoms of the metal M, which are agglomerated as described above, may provide electrons and may also enhance adhesion between the substrate 100 and the graphene layer 200. In other words, the aggregated atoms of the metal M may improve adhesion between the substrate 100 and the graphene layer 200.

In the example shown in FIGS. 7A and 7B, the substrate 100 has a flat upper surface like the substrate 120 described above. However, embodiments are not limited thereto, and the substrate 110 having a trench structure may be used as the substrate 100.

Figure 8A:
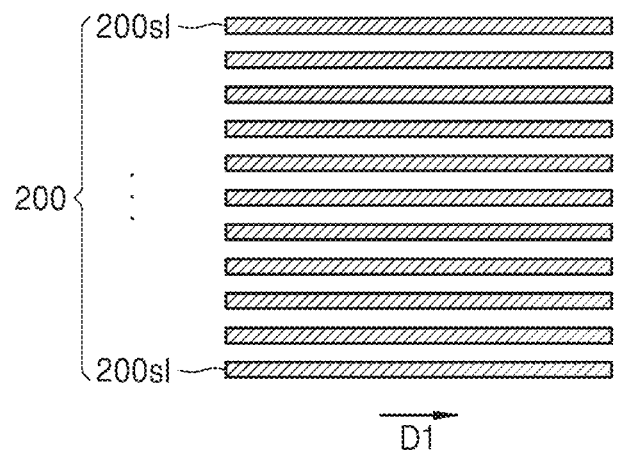
FIG. 8A to 8C are cross-sectional views illustrating cross-sections of graphene layers included in a wiring according to example embodiments.
Figure 8B:
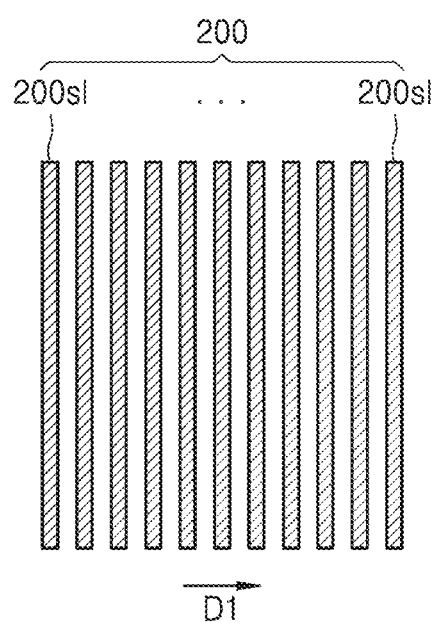
Figure 8C:
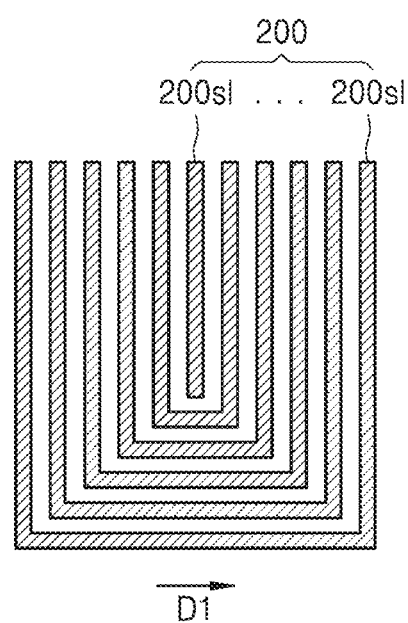

FIGS. 8A to 8C are cross-sectional views illustrating stacked structures of graphene layers 200 manufactured by wiring manufacturing methods according to example embodiments.

A graphene layer 200, which is grown through the growth operation S110 of the wiring manufacturing method according to an example embodiment, may include at least one layer. For example, the graphene layer 200 may include a unit graphene layer 200sl, or a plurality of unit graphene layers 200sl. The unit graphene layers 200sl may be formed in a plurality of directions. The unit graphene layers 200sl may be formed in the same direction or different directions. For example, referring to FIG. 8A, at least one unit graphene layer 200sl may be formed in a direction substantially parallel to a surface direction D1 of the substrate 110 or 120. For example, when the substrate 120 having a flat upper surface is used, the surface direction D1 may be a direction parallel to the flat upper surface of the substrate 120. For example, when the substrate 110 having a trench structure is used, the surface direction D1 may be a direction parallel to the trench bottom surface 111b. The surface direction D1 of the substrate 110 or 120 may be perpendicular to the thickness direction of the substrate 110 or 120, but is not limited thereto. When the substrate 110 having a trench structure is used, the thickness of the graphene layer 200 or the number of unit graphene layers 200sl may be determined by the height of the trench sidewalls 113s. The graphene layer 200 may entirely fill the trench structure or may partially fill the trench structure. For example, the graphene layer 200 may be formed apart from the trench sidewalls 113s with air gaps therebetween.

Referring to FIG. 8B, at least one unit graphene layer 200sl may be formed in a direction substantially perpendicular to the surface direction D1 of the substrate 110 or 120. In this case, the surface direction D1 of the substrate 110 or 120 may be perpendicular to the thickness direction of the substrate 110 or 120, but is not limited thereto. When the substrate 110 having a trench structure is used, the thickness of the graphene layer 200 or the number of unit graphene layers 200sl may be determined by the width of the trench bottom surface 111b. The graphene layer 200 may entirely fill the trench structure or may partially fill the trench structure. For example, the graphene layer 200 may be formed apart from the trench sidewalls 113s with air gaps therebetween.

Referring to FIG. 8C, at least one unit graphene layer 200sl may include: a portion substantially perpendicular to the surface direction D1 of the substrate 110 or 120; and a portion substantially parallel to the surface direction D1 of the substrate 110 or 120. In other words, the at least one unit graphene layer 200sl may have a two-dimensional cross-section having a trench structure. For example, when the substrate 110 having a trench structure is used, the trench structure of the at least one unit graphene layer 200sl may correspond to the trench structure of the substrate 110 and may be formed inside the trench structure of the substrate 110. As the number of unit graphene layers 200sl increases, the size of the trench structure of each unit graphene layer 200sl may gradually decrease. A unit graphene layer 200sl, which is last formed, may be substantially perpendicular to the surface direction D1 of the substrate, but is not limited thereto. In the example described above, the trench structure of each unit graphene layer 200sl corresponds to the trench structure of the substrate 110, but embodiments are not limited thereto. For example, unit graphene layers 200sl, of which the trench structure has an aspect ratio greater than the aspect ratio of the trench structure of the substrate 110, may be formed, and thus, the graphene layer 200 may be apart from the trench sidewalls 113s with air gaps therebetween. In addition, even when the substrate 120 having a flat upper surface without a trench structure is used, at least one unit graphene layer 200sl having a trench structure may be formed on the substrate 120.

The growth directions of the graphene layer 200 described above are merely non-limiting examples, and the graphene layer 200 may be grown in various other directions.

According to an example embodiment, the wiring manufacturing method may include an operation of planarizing an upper portion of the graphene layer 200. The planarizing operation may be performed before the doping operation S110 or after the doping operation S110. The planarizing operation may include a chemical mechanical polishing (CMP) operation. However, the polarizing operation is not limited thereto and may be performed by other methods. Through the planarizing operation, the upper surface of the graphene layer 200 may be planarized as a substantially flat surface. When the substrate 110 including a trench structure is used, the upper surfaces of the protrusions 113 of the substrate 110 and the upper surface of the graphene layer 200 may be planarized as flat surfaces having substantially the same height.

According to an example embodiment, the wiring manufacturing method may provide a method of manufacturing low-resistance wiring 10 by growing a graphene layer 200 at a temperature of about 600° C. or less and doping the graphene layer 200 with a metal M. The resistivity of the graphene layer 200 may be decreased by doping the graphene layer 200 with the metal M, and because the graphene layer 200 is grown at a low temperature, the substrate 110 or 120 or a device on which the graphene layer 200 is grown may not be damaged by heat or may be less damaged by heat. In particular, according to example embodiments, the wiring 10 includes the graphene layer 200 doped with the metal M and thus has low resistivity, and when the wiring 10 is used for a small device, the wiring 10 may replace wiring containing a high-resistivity metal. In addition, the wiring manufacturing method of example embodiments may be applied to not only forming a back-end-of-line (BEOL) but also forming an FEOL.

According to an example embodiment, the wiring 10 may include: the substrate 110 or 120; and the graphene layer 200 which is formed on the substrate 110 or 120 and doped with the metal M, wherein the content of the metal M in the graphene layer 200 doped with the metal M may be about 1 at % to about 50 at %, and the ratio of carbon having an $sp^2$ bond structure to total carbon in the graphene layer 200 doped with the metal M may be about 50 at % to about 99 at %. When forming a BEOL, the wiring 10 according to example embodiments may be used to form an interconnect structure. The wiring 10 according to example embodiments may include the graphene layer 200 doped with the metal M and may thus be provided as low-resistance wiring 10.

The wiring 10 according to example embodiments may be manufactured by the wiring manufacturing method of example embodiments, but is not limited thereto.

The substrate of the wiring 10 of example embodiments may be the substrate 120 having a flat upper surface or the substrate 110 having a trench structure. The substrate 110 having a trench structure may have a non-planar upper surface having a height difference.

When the substrate 110 having a trench structure is used, the substrate 110 may include: the body 111 including the trench bottom surface 111b; and the protrusions 113 surrounding the trench sidewalls 113s. The body 111 and the protrusions 113 of the substrate 110 may include a dielectric material or a semiconductor material, and the protrusions 113 may extend from the body 111. The graphene layer 200 doped with the metal M may be arranged to fill the trench structure, and in this case, for example, the graphene layer 200 doped with the metal M may be grown or arranged to entirely or partially fill the trench structure. When the graphene layer 200 doped with the metal M is arranged to entirely fill the trench structure, the sides of the graphene layer 200 may be in contact with the protrusions 113 (or the trench sidewalls 113s) of the trench structure. When the graphene layer 200 doped with the metal M is arranged to partially fill the trench structure, for example, the sides of the graphene layer 200 doped with the metal M may be apart from the protrusions 113 (or the trench sidewalls 113s) of the trench structure. When the sides of the graphene layer 200 doped with the metal M is spaced apart from the protrusions 113 of the trench structure, the voids 130 may be formed in spaces between the sides of the graphene layer 200 and the protrusions 113. The voids 130 may be filled with air or the like, and because the voids 130 form air gaps, the voids 130 may function as a dielectric material.

When the substrate 120 having a flat upper surface is used, the graphene layer 200 doped with the metal M may be arranged on the upper surface of the substrate 120. The graphene layer 200 doped with the metal M may be arranged on a portion of the upper surface, and the voids 130 including air or the like may be formed on the other portions of the upper surface on which the graphene layer 200 doped with the metal M is not formed. The voids 130 may be filled with air or the like, and when the voids 130 are air gaps filled with air, the air gaps may function as a dielectric material.

The substrates 110 and 120 may include a semiconductor material, a dielectric material, or a semiconductor material on a dielectric material. Because the semiconductor material and the dielectric material has been described above, descriptions thereof will be omitted here. The dielectric material included in the substrates 110 and 120 may include a material (low-κ material) having a low dielectric constant κ among various dielectric materials. For example, the low-κ dielectric material included in the substrates 110 and 120 may have a dielectric constant κ of less than about 3.6. The low-κ material has been described above, and thus, a description thereof is omitted here.

The graphene layer 200 doped with the metal M, which is included in the wiring 10, may include intrinsic graphene or nanocrystalline graphene.

The wiring 10 may further include a barrier 400 (refer to FIG. 9B) between the substrate 110 or 120 and the graphene layer 200 doped with the metal M, and the barrier 400 may reduce or prevent diffusion of the metal M from the graphene layer 200 into the substrate 110 or 120. For example, the thickness of the barrier 400 may be several hundred picometers to several tens of nanometers (e.g., 20 nm to 100 nm).

In the wiring 10, according to some example embodiments, a liner 500 (refer to FIG. 9B) may be further arranged between the substrate 110 or 120 and the graphene layer 200 doped with the metal M to improve adhesion between the substrate 110 or 120 and the graphene layer 200 doped with the metal M. For example, the thickness of the liner 500 may be several hundred picometers to several tens of nanometers (e.g., 20 nm to 100 nm).

When the wiring 10 of the example embodiment includes the barrier 400 and the liner 500, the substrate 110 or 120, the barrier 400, the liner 500, and the graphene layer 200 doped with the metal M may be arranged in this stated order.

The wiring 10 of the example embodiment may have a width of about 1 nm to about 100 nm and/or a height of about 1 nm to about 100 nm. For example, the wiring 10 may have a width of about 1 nm to about 20 nm and/or a height of about 1 nm to about 20 nm. However, embodiments are not limited thereto, and for example, a plurality of pieces of a wiring 10 may be connected to form large wiring 10.

The graphene layer 200 doped with the metal M of the wiring 10 of the example embodiment may have a large amount of carbon having an $sp^2$ bond structure. For example, the ratio of carbon having an $sp^2$ bond structure to total carbon in the graphene layer 200 doped with the metal M of the wiring 10 may be about 50% to about 99%. Furthermore, in the graphene layer 200 doped with the metal M of the wiring 10, the content of carbon having an $sp^2$ bond structure may be greater than the content of carbon having an spa bond structure. In addition, the graphene layer 200 doped with the metal M of the wiring 10 of the example embodiment may include hydrogen (H), and the content of hydrogen (H) in the graphene layer 200 may be about 1 at % to about 20 at %. However, embodiments are not limited thereto, and the content of hydrogen (H) may be higher or lower than the range stated above.

The wiring 10 of example embodiments may include the graphene layer 200 doped with the metal M. The metal M may be located on a surface of the graphene layer 200, the inside of the graphene layer 200, or grain boundaries of the graphene layer 200. The grain boundaries may be formed on the surface of the graphene layer 200 or may be formed on each of the plurality of unit graphene layers 200sl positioned inside the graphene layer 200. Positions which are doped with the metal M have been described with reference to FIGS. 4A to 4C, and thus, descriptions thereof are omitted here.

The metal M doped into the graphene layer 200 of the wiring 10 of example embodiments may include one selected from the group consisting of ruthenium (Ru), aluminum (Al), molybdenum (Mo), tungsten (W), titanium (Ti), platinum (Pt), tantalum (Ta), rhodium (Rh), iridium (Ir), cobalt (Co), nickel (Ni), chromium (Cr), hafnium (Hf), titanium nitride (TiN), and an alloy thereof.

The wiring 10 of example embodiments may have low resistivity within the range of about 800 μΩ·cm or less. For example, the wiring 10 may have a resistivity of about 600 μΩ·cm or less.

The wiring 10 of example embodiments may have low resistivity because the wiring 10 includes the graphene layer 200 doped with the metal M. When the wiring 10 of example embodiments is used for a small device, the wiring 10 may replace wiring including a high-resistivity metal. In addition, the wiring 10 of example embodiments may be used at a BEOL and an FEOL as well, for example, as an electrode.

Figure 9A:
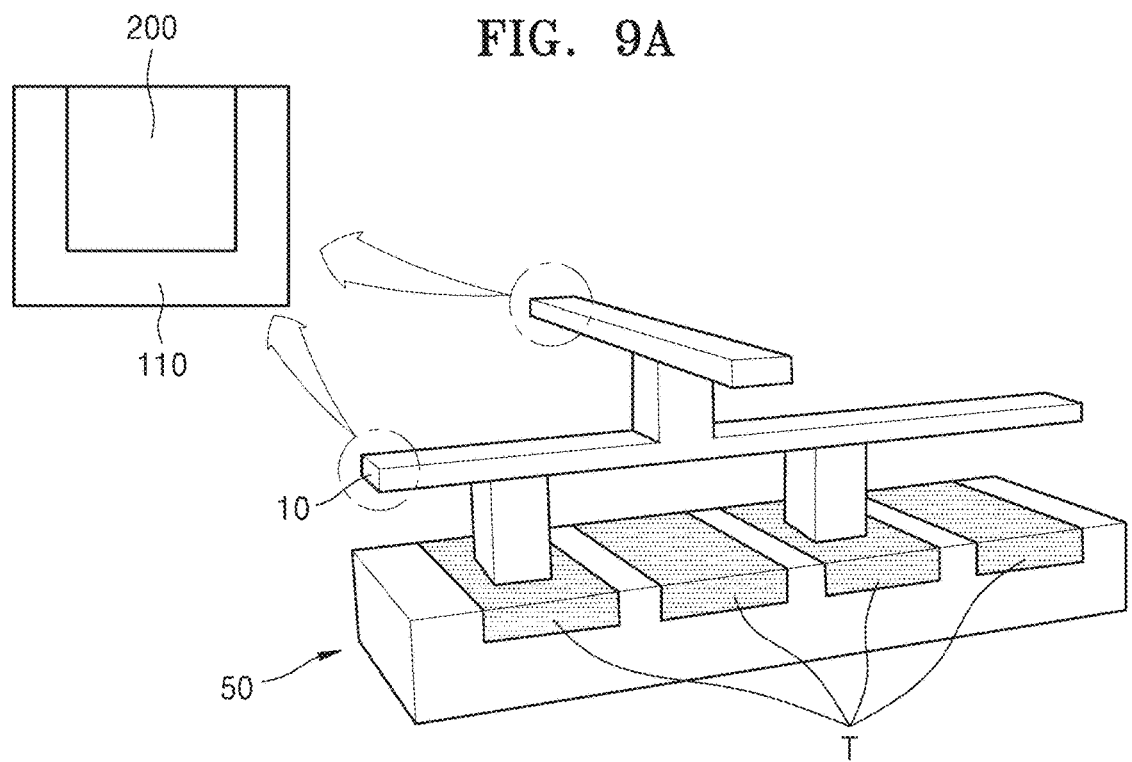
FIG. 9A is a conceptual view illustrating a device including a wiring according to an example embodiment.
Figure 9B:
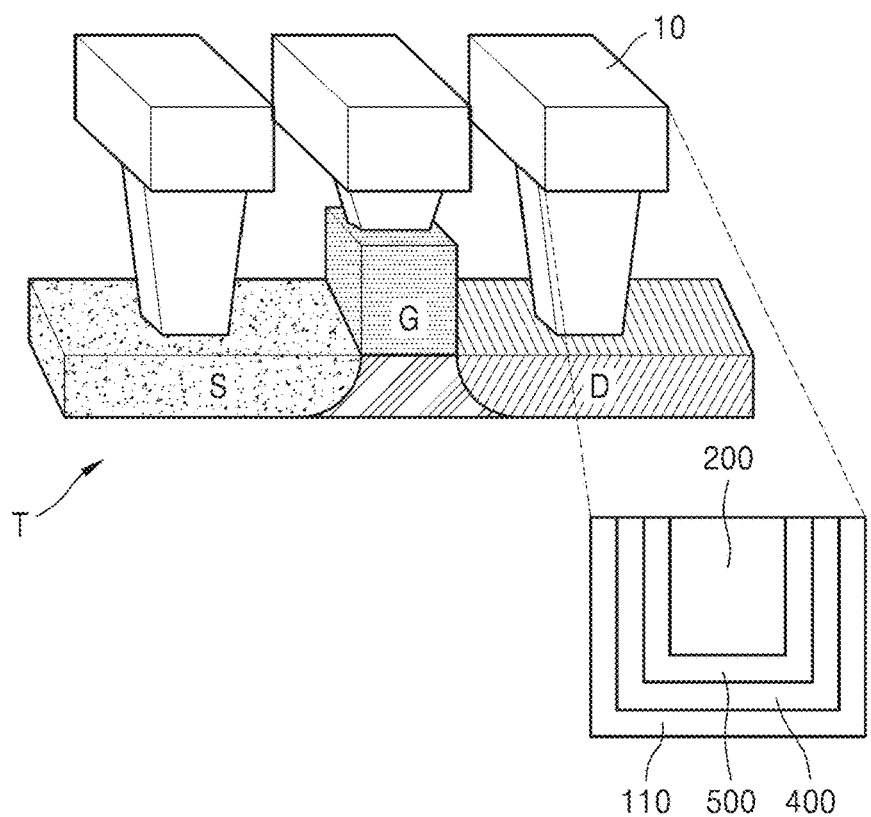
FIG. 9B is a conceptual view illustrating that the wiring is connected to a transistor according to an example embodiment.

FIG. 9A is a conceptual view illustrating a device 50 including wiring 10 according to an example embodiment, and FIG. 9B is a conceptual view illustrating that the wiring 10 is connected to a transistor according to an example embodiment.

Referring to FIGS. 9A and 9B, according to an example embodiment, the device 50 may include the wiring 10 described with reference to FIGS. 1 to 8C and may be manufactured by the wiring manufacturing method described with reference to FIGS. 1 to 8C.

Referring to FIGS. 9A and 9B, according to an example embodiment, the device 50 may include elements such as a transistor T, which has a source S, a drain D, and a gate G along a front end of line (FEOL) feature of the device 50. The transistor T may also include a source electrode, a drain electrode, and a gate electrode, and according to an example embodiment. The wiring 10 may be electrically connected to at least one selected from the group consisting of the source electrode, the drain electrode, and the gate electrode. That is, the wiring 10 may be applied to a back end of line (BEOL) feature of the device 50 as an interconnect structure. According to an embodiment, the wiring 10 may include a substrate 110 or 120, a barrier 400, a liner 500, and a graphene layer 200 doped with a metal M. For example, the wiring 10 of example embodiments may be applied to a device such as a dynamic random access memory (DRAM) cell transistor, a vertical DRAM, a 3D-NAND flash memory, a DRAM capacitor, or a logic element. When manufacturing the device 50, the wiring manufacturing method of example embodiments may be used, and because the wiring 10 is formed on the device 50 at a low temperature equal to or less than about 600° C., deterioration of the device 50 may be reduced or prevented.

Figure 10:
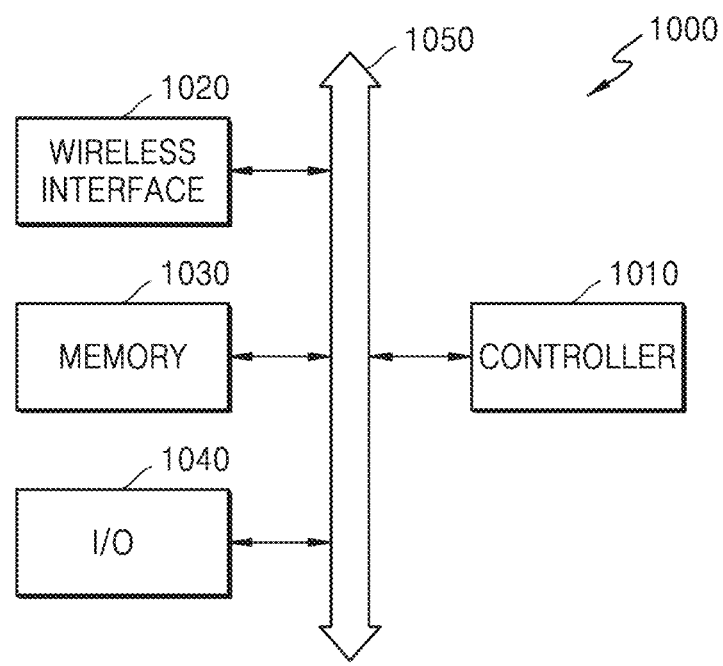
FIG. 10 is a block diagram of an electronic system according to an embodiment.

FIG. 10 is a block diagram of an electronic system according to an embodiment.

The electronic system 1000 may form a wireless communication device or a device capable of transmitting and/or receiving information in a wireless environment. The electronic system 1000 may include a controller 1010, an input/output device (I/O) 1020, a memory 1030, and a wireless interface 1040, which are connected to each other through a bus 1050.

The controller 1010 may include at least one selected from the group consisting of a microprocessor, a digital signal processor, and a processing device similar thereto. User's commands may be input through the I/O device 1020 for the controller 1010, and the I/O device 1020 may include at least one selected from the group consisting of a keypad, a keyboard, and a display. The memory 1030 may be used to store instructions executed by controller 1010 and/or store data. For example, the memory 1030 may be used to store user data. The electronic system 1000 may use the wireless interface 1040 to transmit/receive data through a wireless communication network. The wireless interface 1040 may include an antenna and/or a wireless transceiver. In some embodiments, the electronic system 1000 may be used for communication interface protocols (e.g., a third generation communication system such as code division multiple access (CDMA), global system for mobile communications (GSM), north American digital cellular (NADC), extended-time division multiple access (E-TDMA), and/or wide band code division multiple access (WCDMA), a fourth generation communication system such as 4G LTE, a fifth generation communication system and the like). The electronic system 1000 may include at least one wiring 10 and/or device 50 according to the various embodiments described with reference to FIGS. 2A, 2B, 3, 9A, and 9B. For example, the memory 1030 may include the device 50 described in FIGS. 9A and 9B.

Figure 11:
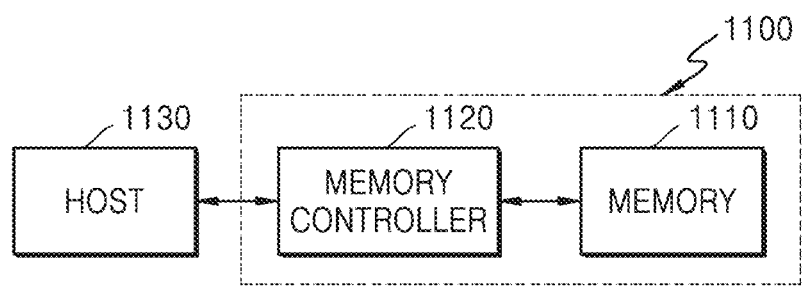
FIG. 11 is a block diagram of an electronic system including an electronic device including according to an embodiment.

FIG. 11 is a block diagram of an electronic system including an electronic device including according to an embodiment.

The electronic system 1100 includes a memory 1110 and a memory controller 1120. The memory controller 1120 may control the memory 1110 to read data from and/or write data to the memory 1110 in response to a request from the host 1130. At least one of the memory 1110 and the memory controller 1120 may include the wiring 10 and/or device 50 according to the various embodiments described with reference to FIGS. 2A, 2B, 3, 9A, and 9B. For example, the memory 1110 may include the device 50 described in FIGS. 9A and 9B.

In addition, the wiring 10 may be used for or in various electrical devices besides the above-mentioned devices, and such electronic devices may be partially or entirely used in various electronic devices. Examples of such electronic devices may include: display devices such as TVs; personal computers (PCs); laptop computers; smart devices such as smartphones or a tablets; wearable devices such as smart watches; head-mounted displays; head-up displays; augmented or virtual reality glasses; and autonomous vehicles.

The wiring 10 is not limited to being applied to the BEOL of the device 50, and may be applied to the FEOL of the device 50. For example, the wiring 10, which includes the graphene layer 200 doped with the metal M and arranged on the substrate 120 having a flat upper surface, may be applied to an FEOL element for a structure requiring electrical connection.

As described above, according to the wiring manufacturing method of the one or more of the above embodiments, low-resistance wiring may be manufactured by growing a graphene layer at a temperature of about 600° C. or less, and doping the graphene layer with a metal.

According to the wiring manufacturing method, a graphene layer may be grown on a substrate or a device at a relatively low temperature, and thus, deterioration of the substrate or the device may be reduced or prevented.

The wiring including the graphene layer according to the one or more of the above embodiments may be used in a small device as low-resistance wiring.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a wiring, the method comprising:
    growing a graphene layer on a substrate using a plasma of a hydrocarbon at a temperature of about 200° C. to about 600° C. by plasma enhanced chemical vapor deposition (PECVD); and
    doping the graphene layer with a metal.
2. The method of claim 1, wherein
    the growing the graphene layer comprises injecting the hydrocarbon and a precursor comprising the metal together into a chamber, and
    the doping the graphene layer is performed as in-situ doping by the PECVD in the growing the graphene layer.
3. The method of claim 1, wherein
    the doping the graphene layer with the metal includes performing atomic layer deposition (ALD) at least once or chemical vapor deposition (CVD) at least once.
4. The method of claim 1, further comprising:
    depositing a metal thin film on the substrate prior to the growing the graphene layer, wherein
    the graphene layer is doped with the metal as the metal thin film undergoes agglomeration during the growing the graphene layer.
5. The method of claim 1, wherein
    the substrate has a trench structure comprising a body and a protrusion, and
    the graphene layer is grown inside the trench structure.
6. The method of claim 5, wherein
    in the growing the graphene layer, the graphene layer is grown spaced apart from the protrusion such that an air gap is between a side of the graphene layer and the protrusion.
7. The method of claim 1, wherein the metal comprises one of ruthenium (Ru), aluminum (Al), molybdenum (Mo), tungsten (W), titanium (Ti), platinum (Pt), tantalum (Ta), rhodium (Rh), iridium (Ir), cobalt (Co), nickel (Ni), chromium (Cr), hafnium (Hf), titanium nitride (TiN), or an alloy thereof.
8. The method of claim 1, wherein
    the graphene layer comprises at least one layer,
    the at least one layer is formed in a direction substantially parallel or substantially perpendicular to a surface direction of the substrate, or
    the at least one layer is formed to have a structure comprising a portion substantially perpendicular to the surface direction of the substrate and a portion substantially parallel to the surface direction of the substrate.
9. The method of claim 1, wherein
    the doping the graphene layer includes at least one of doping a surface of the graphene layer with the metal, doping an inside of the graphene layer with the metal, and doping a grain boundary of the graphene layer with the metal.
10. The method of claim 1, further comprising:
    forming a barrier on the substrate before the forming the graphene layer, wherein
    the growing the graphene layer on the substrate includes growing the graphene layer on the barrier.
11. A wiring comprising:
    a substrate; and
    a graphene layer doped with a metal on the substrate,
    wherein a metal content of the graphene layer doped with the metal is about 1 at % to about 50 at %, and
    a ratio of carbon having an $sp^2$ bond structure to total carbon in the graphene layer doped with the metal is about 50% to about 99%.
12. The wiring of claim 11, wherein the substrate has a trench structure,
    the substrate comprises a dielectric material having a dielectric constant κ of about 3.6 or less, and
    the graphene layer doped with the metal is inside the trench structure.
13. The wiring of claim 11, wherein a hydrogen (H) content of the graphene layer doped with the metal is in a range of about 1 at % to about 20 at %.

14. The wiring of claim 11, wherein the metal includes one of ruthenium (Ru), aluminum (Al), molybdenum (Mo), tungsten (W), titanium (Ti), platinum (Pt), tantalum (Ta), rhodium (Rh), iridium (Ir), cobalt (Co), nickel (Ni), chromium (Cr), hafnium (Hf), titanium nitride (TiN), and an alloy thereof.

15. The wiring of claim 11, wherein
the substrate includes a protrusion,
the graphene layer doped with the metal is spaced apart from the protrusion such that an air gap is between the protrusion and a side of the graphene layer doped with the metal.

16. The wiring of claim 11, wherein
a width of the graphene layer doped with the metal is about 1 nm to about 20 nm,
a height the graphene layer doped with the metal is about 1 nm to about 20 nm, and
a resistivity of the graphene layer doped with the metal is about 800 μΩ·cm or less.

17. The wiring of claim 11, wherein at least one layer included in the graphene layer doped with the metal is arranged in a direction substantially parallel to a surface direction of the substrate.

18. The wiring of claim 11, wherein
at least one layer included in the graphene layer doped with the metal is arranged in a direction substantially perpendicular to a surface direction of the substrate, or
the least one layer included in the graphene layer doped with the metal has a structure comprising a portion substantially perpendicular to the surface direction of the substrate and a portion substantially parallel to the surface direction of the substrate.

19. The wiring of claim 11, wherein at least one of a surface of the graphene layer, an inside of the graphene layer, and a grain boundary of the graphene layer is doped with the metal.

20. An electronic device comprising:
the wiring of claim 11; and
a transistor comprising a source electrode, a drain electrode, and a gate electrode, wherein
the wiring is electrically connected to at least one the source electrode, the drain electrode, and the gate electrode.

* * * * *